(12) United States Patent
Fang (10) Patent No.: US 10,686,055 B2
(45) Date of Patent: Jun. 16, 2020

(54) SEMICONDUCTOR TRANSISTOR COMPRISING COUNTER-DOPED REGIONS AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Lei Fang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/213,094

(22) Filed: Jul. 18, 2016

(65) Prior Publication Data
US 2017/0033215 A1    Feb. 2, 2017

(30) Foreign Application Priority Data
Jul. 29, 2015    (CN) .......................... 2015 1 0456890

(51) Int. Cl.
*H01L 29/66* (2006.01)
*H01L 29/78* (2006.01)
(Continued)

(52) U.S. Cl.
CPC ...... *H01L 29/66659* (2013.01); *H01L 29/063* (2013.01); *H01L 29/0634* (2013.01);
(Continued)

(58) Field of Classification Search
CPC ............ H01L 29/7835; H01L 29/0634; H01L 29/0847; H01L 29/66659; H01L 29/7816;
(Continued)

(56) References Cited

U.S. PATENT DOCUMENTS

| | | | |
|---|---|---|---|
| 2003/0102507 A1* | 6/2003 | Uno ..................... | H01L 29/0634 257/342 |
| 2004/0097057 A1* | 5/2004 | Meyyappan ...... | H01L 21/26513 438/514 |

(Continued)

FOREIGN PATENT DOCUMENTS

| | | |
|---|---|---|
| CN | 1627536 A | 6/2005 |
| CN | 102760769 A | 10/2012 |
| CN | 104112769 A | 10/2014 |

*Primary Examiner* — David Chen
(74) *Attorney, Agent, or Firm* — Anova Law Group, PLLC (57) ABSTRACT

The present disclosure provides a method for forming a semiconductor device, including: providing a semiconductor substrate; forming a well region and a drift region in the semiconductor substrate; and forming one or more counter-doped regions in the drift region, the one or more counter-doped regions being aligned along a direction vertical to the semiconductor substrate to divide the drift region into a plurality of parts. The semiconductor fabrication method also includes: forming a gate structure on the semiconductor substrate, the gate structure covering a portion of the well region and a portion of the drift region; and forming a source electrode in the well region on one side of the gate structure and a drain electrode in the drift region on another side of the gate structure.

14 Claims, 8 Drawing Sheets

(51) Int. Cl.
*H01L 29/06* (2006.01)
*H01L 29/423* (2006.01)
*H01L 29/10* (2006.01)

(52) U.S. Cl.
CPC .... *H01L 29/42368* (2013.01); *H01L 29/7835* (2013.01); *H01L 29/0653* (2013.01); *H01L 29/1045* (2013.01); *H01L 29/1095* (2013.01)

(58) Field of Classification Search
CPC ........... H01L 29/42368; H01L 29/1095; H01L 29/1045; H01L 29/66681
USPC ......................................... 438/286, 306, 420
See application file for complete search history.

(56) References Cited

U.S. PATENT DOCUMENTS

| | | | | |
|---|---|---|---|---|
| 2005/0127450 A1* | 6/2005 | Takehana | ............ | H01L 29/0634 257/371 |
| 2005/0167708 A1* | 8/2005 | Rhodes | ............. | H01L 27/14601 257/291 |
| 2009/0159968 A1* | 6/2009 | Merchant | ........ | H01L 21/823425 257/337 |
| 2010/0025726 A1* | 2/2010 | Paul | .................... | H01L 29/0634 257/141 |
| 2012/0205738 A1* | 8/2012 | Yang | ................. | H01L 29/66689 257/335 |
| 2014/0183631 A1* | 7/2014 | Hao | ................. | H01L 21/823412 257/338 |
| 2014/0306285 A1* | 10/2014 | Kim | .................... | H01L 29/7835 257/343 |
| 2015/0243766 A1* | 8/2015 | Tu | ..................... | H01L 29/66681 257/329 |
| 2015/0243780 A1* | 8/2015 | Lin | ..................... | H01L 29/7823 257/339 |
| 2015/0364598 A1* | 12/2015 | Jung | ................... | H01L 29/0653 257/343 |
| 2016/0351704 A1* | 12/2016 | Duan | ................. | H01L 29/7816 |

* cited by examiner

SEMICONDUCTOR TRANSISTOR COMPRISING COUNTER-DOPED REGIONS AND FABRICATION METHOD THEREOF

CROSS-REFERENCES TO RELATED APPLICATIONS

This application claims the priority of Chinese Patent Application No. 201510456890.1, filed on Jul. 29, 2015, the entire content of which is incorporated herein by reference.

FIELD OF THE DISCLOSURE

The present disclosure relates to the field of semiconductor technology and, more particularly, relates to a semiconductor device and a fabrication method for forming the semiconductor device.

BACKGROUND

Laterally double-diffused metal-oxide semiconductors (LDMOS) transistors are mainly used in power integrated circuit (IC). LDMOS transistors generally have advantages such as good thermal and frequency stabilities, higher gain and durability, lower feedback capacitance and thermal resistance, constant input impedance, and simpler biasing circuits. Thus, LDMOS transistors have been widely used in portable devices, radars, navigation systems, etc.

Figure 1:
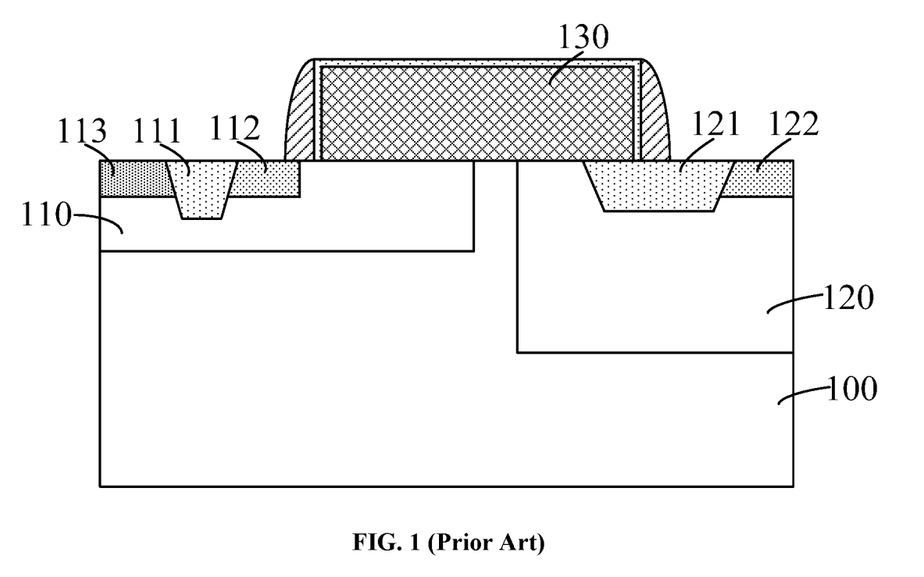
FIG. 1 is a cross-sectional illustration of a conventional LDMOS transistor.

Taking an N-type device as an example, a conventional N-type LDMOS transistor is shown in FIG. 1. The LDMOS transistor includes a semiconductor substrate 100, a P-type well region 110 and an N-type drift region 120. The LDMOS transistor also includes a first shallow trench insulating (STI) structure 111 in the P-type well 110, a second STI structure 121 in the N-type drift region 120, and a gate structure 130 on the semiconductor substrate 100. The LDMOS transistor also includes a source electrode 112 and a body-tie electrode 113 on one side of the gate electrode 130. The source electrode 112 and the body-tie electrode 113 are located in the P-type well region 110 and may be separated from each other by the first STI structure 111. The LDMOS transistor further includes a drain electrode 122 located on the other side of the gate structure 130 in the N-type drift region 120.

However, a conventional LDMOS transistor often has a low breakdown voltage. The disclosed semiconductor device and the fabrication method for forming the semiconductor device are directed to solve one or more problems set forth above and other problems.

BRIEF SUMMARY OF THE DISCLOSURE

The present disclosure provides a semiconductor device and a fabrication method for forming the semiconductor device. By using the disclosed semiconductor device and fabrication method, the breakdown voltage of the LDMOS transistor can be improved.

One aspect of the present disclosure provides a fabrication method for forming a semiconductor device, including: providing a semiconductor substrate; forming a well region and a drift region in the semiconductor substrate; and forming one or more counter-doped regions in the drift region, the one or more counter-doped regions being aligned along a direction vertical to the semiconductor substrate to divide the drift region into a plurality of parts. The semiconductor fabrication method also includes: forming a gate structure on the semiconductor substrate, the gate structure covering a portion of the well region and a portion of the drift region; and forming a source electrode in the well region on one side of the gate structure and a drain electrode in the drift region on another side of the gate structure.

Another aspect of the present disclosure provides a semiconductor device, including: a semiconductor substrate with a well region and a drift region in the semiconductor substrate; one or more counter-doped regions in the drift region, the one or more counter-doped regions being aligned along a direction vertical to the semiconductor substrate to divide the drift region into a plurality of parts, a type of ions doped in the one or more counter-doped regions being different from a type of ions doped in the drift region; and a gate structure on the semiconductor substrate, the gate structure covering a portion of the well region and a portion of the drift region. The semiconductor device also includes a source electrode in the well region on one side of the gate structure and a drain electrode in the drift region on another side of the gate structure.

Other aspects or embodiments of the present disclosure can be understood by those skilled in the art in light of the description, the claims, and the drawings of the present disclosure

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

LDMOS transistors have been widely used in portable devices, radars, navigation systems, and so on. As electronic devices keep being upgraded to higher configurations, higher performances of LDMOS transistors are demanded. For a conventional LDMOS transistor, to improve the performances, the voltage applied on the gate electrode has been increasing. However, as the voltage is increased, impact ionization in the drift region increases or intensifies, which accelerates the breaking down of the LDMOS transistor. That is, for a conventional LDMOS transistor, as the performances are improved, the breakdown voltage can be impaired or decreased.

To solve the issues described above, one aspect of the present disclosure provides an improved fabrication method for forming a semiconductor device.

According to the disclosed fabrication method, a semiconductor substrate may be provided. A well region and a drift region may be formed in the semiconductor substrate. One or more counter-ion-doped regions or counter-doped regions may be formed in the drift region to separate or divide the drift region along a direction that is vertical to the semiconductor substrate. The type of ions doped in the counter-doped regions may be different from the type of ions doped in the drift region. The boundaries of the counter-doped regions facing the well region may level with the boundary of the drift region, or may exceed the boundary of the drift region. The boundaries of the counter-doped regions facing away from the well region may be within the drift region. One or more counter-doped regions may be formed and may be arranged along a direction vertical to the semiconductor substrate. When more than one counter-doped regions are formed in the drift region, each counter-doped region may be separated from another counter-doped region by a certain distance. A gate structure may be formed on the semiconductor substrate. The gate structure may cover a portion of the well region and a portion of the drift region. A source electrode and a drain electrode may be formed in the semiconductor substrate on two sides of the gate structure. The source electrode may be formed in the well region, and the drain electrode may be formed in the drift region.

In the present disclosure, one or more counter-doped regions may be formed along a direction vertical to the semiconductor substrate. When more than one counter-doped regions are formed, they may be located at different depths of the drift region. Further, the boundaries of the counter-doped regions facing the well region may level with the boundary of the drift region, or may exceed the boundary of the drift region. In this way, the drift region may be divided or separated into a plurality of parts along the direction vertical to the semiconductor substrate. The boundaries of the counter-doped regions facing away from the well region may be within the drift region so that electric current from each part of the drift region may flow into the drain electrode. When the LDMOS is turned on, the electric current flow into the drift region may be diverged by the counter-doped regions and flow into each part of the drift region. Thus, impact ionization in the drift region may be reduced. The breakdown voltage of the LDMOS transistor may be increased or improved.

Figure 14:
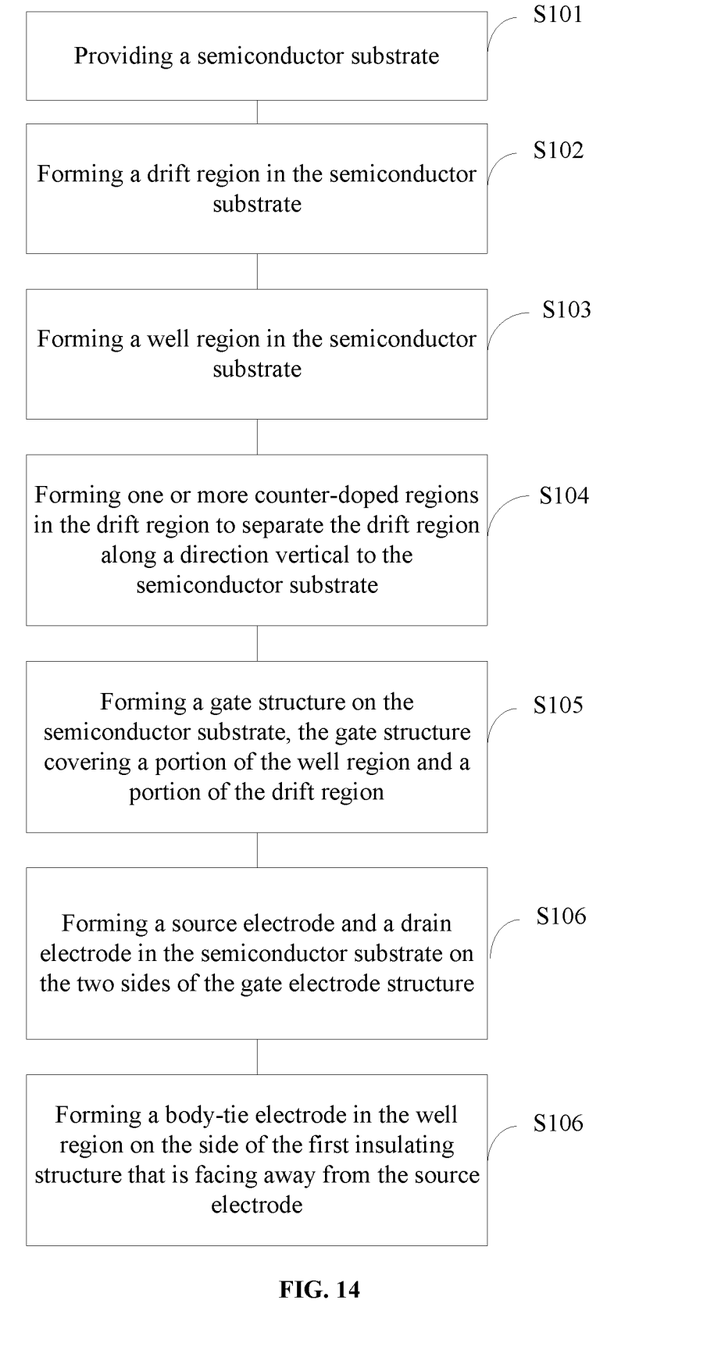
FIG. 14 illustrates an exemplary fabrication process of an LDMOS transistor consistent with various disclosed embodiments.

FIG. 14 illustrates an exemplary fabrication process of the semiconductor device and FIGS. 2-8 illustrate an exemplary semiconductor device corresponding to certain stages of an exemplary fabrication process.

Figure 2:
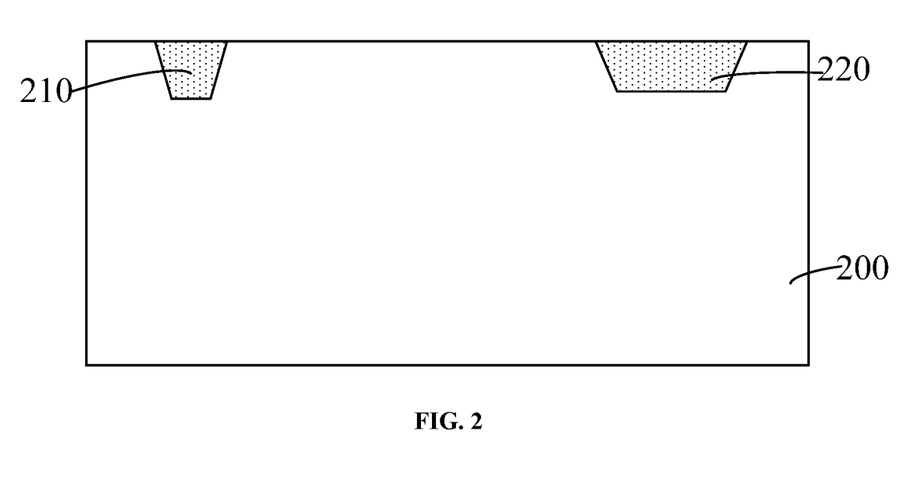
FIGS. 2-8 illustrate an exemplary LDMOS transistor corresponding to certain stages of an exemplary fabrication process consistent with various disclosed embodiments.

As shown in FIG. 14, at the beginning of the fabrication process, a semiconductor substrate is provided (S101). FIG. 2 illustrates a corresponding semiconductor device.

As shown in FIG. 2, a semiconductor substrate 200 can be provided. The semiconductor substrate 200 may be a silicon substrate, a Ge substrate, a SiC substrate, a SiGe substrate, and/or any other suitable substrates. In one embodiment, the semiconductor substrate 200 may be a single-crystal Si substrate.

A first insulating structure 210 and a second insulating structure 220 may be formed in the semiconductor substrate 200. The location of the first insulating structure 210 may correspond to the location of the subsequently-formed well. The location of the second insulating structure 220 may correspond to the location of the subsequently-formed drift region.

In one embodiment, the first insulating structure 210 and the second insulating structure 220 may each be an STI structure or any other suitable insulating structure.

A process to form the first insulating structure 210 and the second insulating structure 220 may include the following steps. The semiconductor substrate 200 may be etched to form a first trench (not labeled) and a second trench (not labeled). The first trench and the second trench may be filled with insulating materials. The filled insulating materials may be planarized to form the first insulating structure 210 and the second insulating structure 220.

The insulating materials may include $SiO_2$. The fabrication process to fill $SiO_2$ into the first trench and the second trench may include performing a chemical vapor deposition process and/or a physical vapor deposition process, such as a flow chemical vapor deposition (FCVD), a plasma enhanced chemical vapor deposition (PECVD), and/or a high aspect ratios process (HARP, or high aspect ratios chemical vapor deposition process). The planarization process may include a chemical mechanical polishing process. The etching process for etching the substrate may include an anisotropic dry etching process.

In one embodiment, a HARP may be used to fill the first trench and the second trench with $SiO_2$ so that the $SiO_2$ has desired uniformity and density, with little void or defect. The $SiO_2$ thus has desired insulating functions. The second insulating structure 220 may increase the conductive path of the LDMOS transistor and thus increase the breakdown voltage of the LDMOS transistor.

Figure 3:
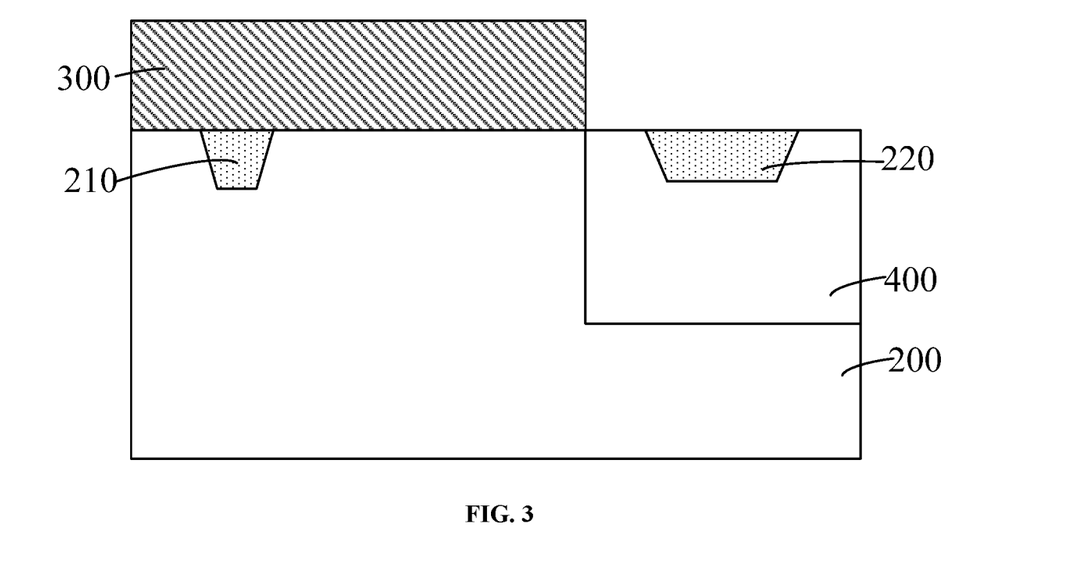

Returning to FIG. 14, after the semiconductor substrate is provided, a drift region is formed in the semiconductor substrate (S102). FIG. 3 illustrates a corresponding semiconductor device.

As shown in FIG. 3, a drift region 400 may be formed in the semiconductor substrate 200. Specifically, a first mask layer 300 may be formed on the semiconductor substrate 200. The first mask layer 300 may be a patterned mask layer. The first mask layer 300 may expose a portion of the semiconductor substrate 200 that corresponds to the subsequently-formed drift region 400. The first mask 300 may be used as the etch mask to perform an ion implantation process on the semiconductor substrate 200. The drift region 400 may be formed in the semiconductor substrate 200.

In one embodiment, the subsequently-formed LDMOS transistor may be an N-type transistor. The drift region 400 may be an N-type drift region. The dopants implanted into the drift region may include P ions, As ions, and/or Sb ions. The implant wafer dose may range from about 2E11 atom/$cm^2$ to about 3E12 atom/$cm^2$.

Further, the drift region 400 may be formed after the first insulating structure 210 and the second insulating structure 220 are formed. The second insulating structure 220 may be located in the drift region 400.

Figure 4:
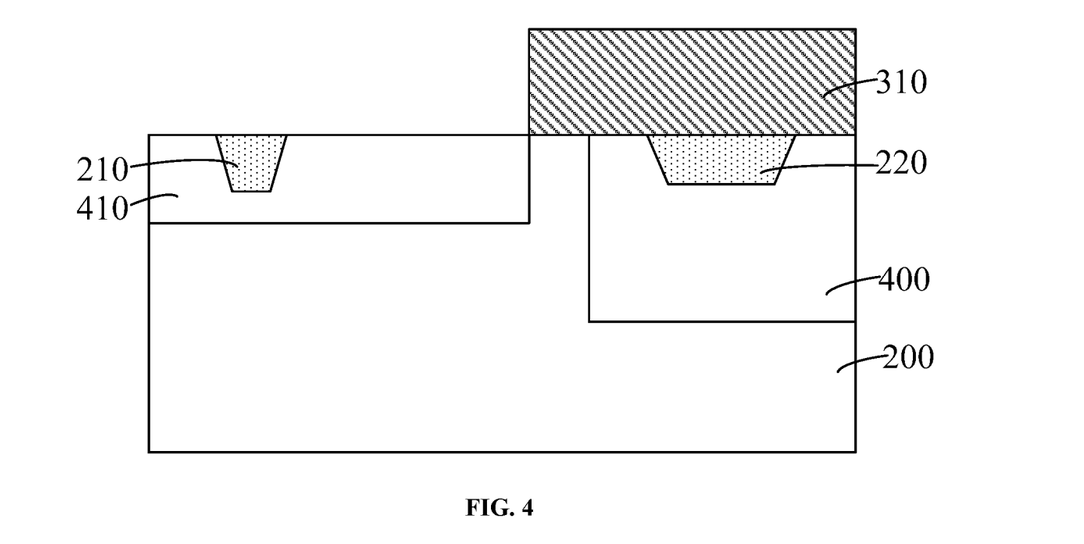

Returning to FIG. 14, after the drift region is formed, a well region is formed in the semiconductor substrate (S103). FIG. 4 illustrates a corresponding semiconductor device.

As shown in FIG. 4, a well region 410 may be formed in the semiconductor substrate 200. Specifically, a second mask layer 310 may be formed on the semiconductor substrate 200. The second mask layer 310 may be a patterned mask layer. The second mask layer 310 may expose a portion of the semiconductor substrate 200 that corresponds to the subsequently-formed well region 410. The second mask layer 310 may be used as the mask to perform an ion implantation process on the semiconductor substrate 200. The well region 410 may be formed in the semiconductor substrate 200.

In one embodiment, the subsequently-formed LDMOS transistor may be an N-type transistor. The well region 410 may be a P-type well region. The dopants implanted into the well region may include B ions, and/or BF ions. The implant wafer dose may range from about 1E14 atom/cm$^2$ to about 5E12 atom/cm$^2$. The type of dopants implanted into the well region 410 may be different from the type of dopants implanted into the drift region 400.

Further, the first insulating structure 210 may be located in the well region 410. The drift region 400 and the well region 410 may be separated by a predetermined distance.

Figure 5:
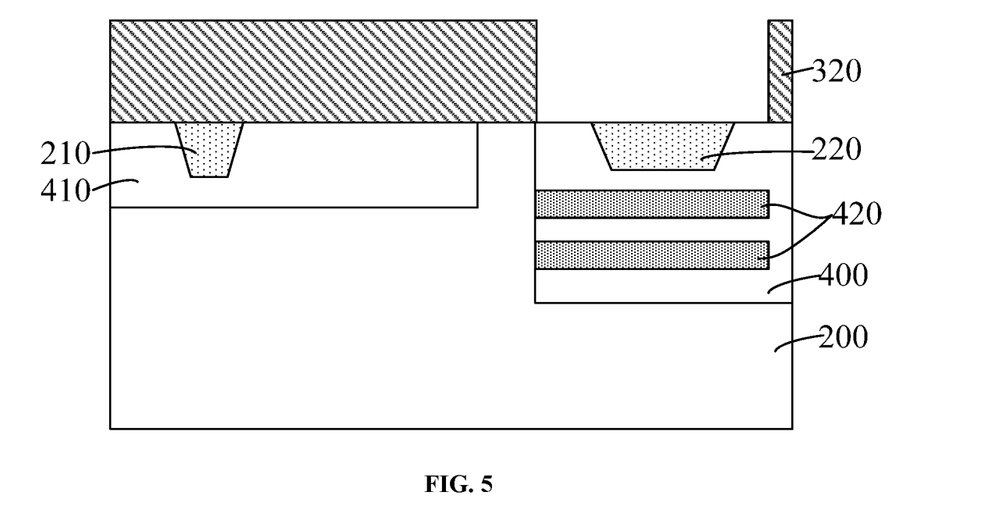

Returning to FIG. 14, after the well region is formed, one or more counter-doped regions are formed in the drift region to separate the drift region along a direction vertical to the semiconductor substrate (S104). FIG. 5 illustrates a corresponding semiconductor device.

As shown in FIG. 5, one or more counter-doped regions 420 may be formed in the drift region 400 to separate the drift region 400 along a direction vertical to the semiconductor substrate 200.

Specifically, the type of dopants implanted into the counter-doped regions 420 may be different from the type of dopants implanted into the drift region 400. The boundaries of the counter-doped regions 420 facing the well region 410 may level with the boundary of the drift region 400. The boundaries of the counter-doped regions 420 facing the well region 410 may also exceed the boundary of the drift region 400. The boundaries of the counter-doped regions 420 facing away from the well region 410 may be located within the drift region 400.

One or more counter-doped regions 420 may be formed. When more than one counter-doped regions 420 are formed, the counter-doped regions 420 may be arranged along a direction vertical to the semiconductor substrate 200, where each counter-doped region 420 may be separated from another counter-doped region 420 by a certain distance. The counter-doped regions 420 may be formed under the second insulating structure 220.

In one embodiment, the drift region 400 may be N-type. The counter-doped regions 420 may be P-type. Two counter-doped regions 420 may be formed. The boundaries of the P-type counter-doped regions 420, i.e., the counter-doped regions 420, facing the well region 410 may level with the boundary of the drift region 400.

A process to form the two P-type counter-doped regions 420 may include the following steps. A third mask layer 320 may be formed on the semiconductor substrate 200. The third mask layer 320 may be a patterned mask. The third mask layer 320 may expose the portion of the semiconductor substrate 200 corresponding to the subsequently-formed P-type counter-doped regions 420. Two ion implantation processes may be performed on the semiconductor substrate 200 using the third mask layer 320. A first P-type counter-doped region may be formed in the semiconductor substrate 200, and a second P-type counter-doped region may be formed under the first P-type counter-doped region. After the two P-type counter-doped regions are formed, the third mask layer 320 may be removed.

Specifically, the P-type counter-doped regions 420 may be located under the second insulating structure 220. Ions or dopants with greater atom mass may be used. The implantation energy may need to be sufficiently high. The implantation energy for the second P-type counter-doped region 420 may be higher than the implantation energy for the first P-type counter-doped region 420. For example, the ions doped into the P-type counter-doped regions 420 may include B ions. The implantation energy to form the first P-type counter-doped region may range from about 200 KeV to about 400 KeV. The implantation energy to form the second P-type counter-doped region may range from about 600 KeV to about 800 KeV.

In addition, because the drift region 400 may be N-type, the counter-doped region 420 may be P-type, during the ion implantation process to form the counter-doped regions, N-type dopants in the drift region 400 may neutralize the P-type dopants of the counter-doped regions 420. To form the P-type counter-doped regions 420 after the neutralization process, during the ion implantation processes, the dopant concentration or implant wafer dose of the P-type dopants may be higher than the N-type dopants in the drift region 400.

Further, in the drift region 400, the dopant concentration or implant wafer dose may decrease as the doping depth increases. Also, the P-type dopants of the counter-doped regions 420 may diffuse in the drift region 400. If the dopant concentrations or implant wafer doses of the P-type dopants are too high, the dopants in the two P-type counter-doped regions may diffuse or mix. Thus, the ion doses or implant wafer doses of the two ion implantation processes for forming the P-type doped regions may be the same, and the implantation energy for the second ion implantation process may be higher than the implantation energy of the first ion implantation process.

Alternatively, the ion dose of the second ion implantation process may be lower than the ion dose of the first ion implantation process, and the implantation energy of the second ion implantation process may be higher than the implantation energy of the first ion implantation process. By using the ion implantation processes described above, the formed two P-type counter-doped regions 420 may be located at different doping depths in the drift region 400, along the direction vertical to the semiconductor substrate 200.

The actual implantation energies of the two ion implantation processes and the implant wafer doses of the P-typed counter-doped regions may be determined or adjusted according to the depth of the drift region 400 and/or the implant wafer dose of the drift region 400. In one embodiment, the implant wafer dose of the first P-type counter-doped region may range from about 3E12 atoms/cm$^2$ to about 6E12 atom/cm$^2$, and the implant wafer dose of the second P-type counter-doped region may range from about 2E12 atoms/cm$^2$ to about 5E12 atom/cm$^2$.

That is, to form the more than one counter-doped region 420 with increasing doping depths, a plurality of ion implantation processes may be performed on the semiconductor substrate. Ion doses or implant wafer doses of the plurality of ion implantation processes may be the same, and implantation energies of the plurality of ion implantation processes may be increased. Alternatively, the ion doses of the plurality of ion implantation processes may be decreased, and the implantation energies of the plurality of ion implantation processes may be increased.

Further, the number of counter-doped regions 420 formed in the drift region 400 should not be limited by the embodiments of the present disclosure. The number of counter-doped regions 420, the implantation energies, and the ion doses should be determined or adjusted based on different applications and/or designs.

Figure 6:
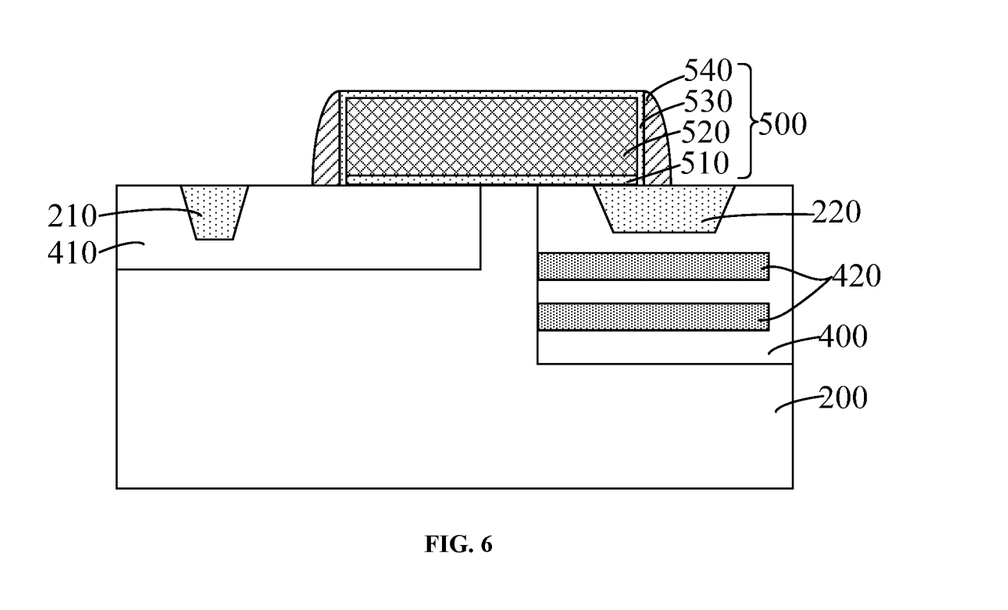

Returning to FIG. 14, after the counter-doped regions are formed, a gate structure is formed on the semiconductor substrate, the gate structure covering a portion of the well region and a portion of the drift region (S105). FIG. 6 illustrates a corresponding semiconductor device.

As shown in FIG. 6, a gate structure 500 may be formed on the semiconductor substrate 200, and the gate structure 500 may cover a portion of the well region 410 and a portion of the drift region 400.

In one embodiment, the gate structure 500 may include a gate oxide layer 510 on the semiconductor substrate 200, a gate electrode layer 520, a covering oxide layer 530, and a sidewall spacer 540. The gate electrode layer 520 may be located on the gate oxide layer 510. The covering oxide layer 530 may cover the top surface and the sidewalls of the gate electrode layer 520. The sidewall spacer 540 may cover the sidewalls of the covering oxide layer 530. The gate electrode layer 520 may be made of poly-silicon.

Specifically, a process to form the gate oxide layer 510 and the gate electrode layer 520 may include the following steps. A gate oxide film may be formed on the semiconductor substrate 200. A gate electrode film may be formed on the gate oxide film. A patterned photoresist layer may be formed on the gate electrode film. The patterned photoresist layer may cover the region of the gate electrode film corresponding to the subsequently-formed gate electrode layer 520 and may be used as an etching mask to consecutively etch the gate electrode film and the gate oxide film until the semiconductor substrate 200 is exposed. The gate oxide layer 510, which is patterned, and the gate electrode layer 520 may be formed.

The sidewall spacer 540 may be a single-layered structure or a multiple-layered structure. When the sidewall spacer 540 is a single-layered structure, the sidewall spacer 540 may be a $SiO_2$ layer. When the sidewall spacer 540 is a multiple-layered structure, the sidewall spacer 540 may be a double-layered structure with a $SiO_2$ layer and a $Si_3N_4$ layer. The sidewall spacer 540 may also be a three-layered structure with a $SiO_2$ layer, a $Si_3N_4$ layer, and a $SiO_2$ layer. In one embodiment, the sidewall spacer 540 may be a double-layered structure with a $SiO_2$ layer and a $Si_3N_4$ layer. The sidewall spacer 540 may be used as a mask for the subsequent ion implantation to form the source electrode and the drain electrode. Thus, the source electrode and the drain electrode may be formed in the semiconductor substrate 200 and may each be separated from the gate electrode layer 520 by a certain distance.

Figure 7:
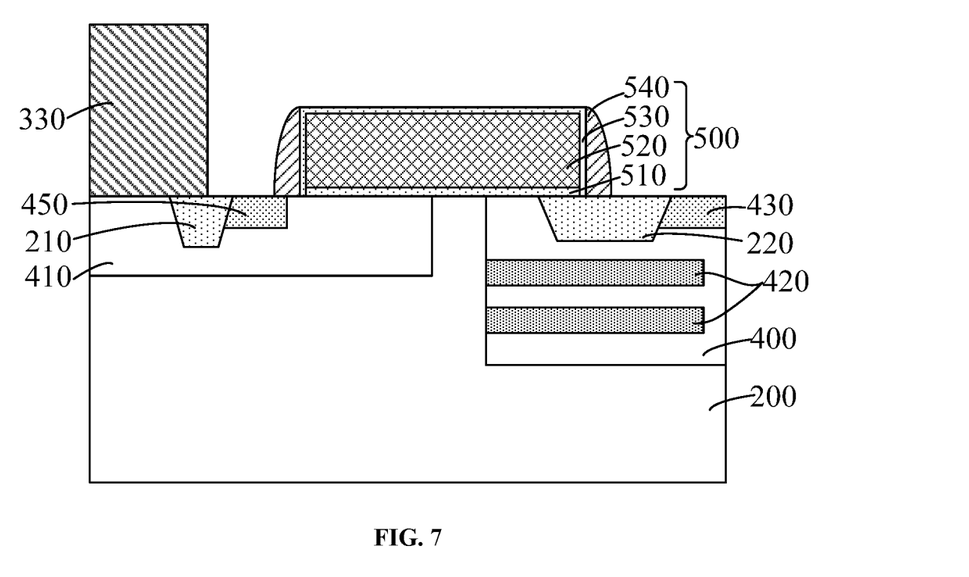

Returning to FIG. 14, after the gate structure is formed, a source electrode and a drain electrode are formed in the semiconductor substrate on the two sides of the gate electrode structure (S106). FIG. 7 illustrates a corresponding semiconductor device.

As shown in FIG. 7, a source electrode 450 and a drain electrode 430 may be formed in the semiconductor substrate on the two sides of the gate structure 500. The source electrode 450 may be formed in the well region 410. The drain electrode 430 may be formed in the drift region 400.

In one embodiment, a process to form the source electrode 450 and the drain electrode 430 may include the following steps. A fourth mask layer 330 may be formed on the semiconductor substrate 200. The fourth mask layer 330 may be a patterned mask layer. The fourth mask layer 330 may expose the gate structure 500 and the regions on the semiconductor substrate 200 corresponding to the subsequently-formed source electrode 450 (or source region 450) and drain electrode 430 (or drain region 430). The fourth mask layer 330 may be used as a mask for performing a heavily-doped ion implantation process on the semiconductor substrate 200. The source electrode 450 and the drain electrode 430 may be formed in the semiconductor substrate 200 on the two sides of the gate structure 500. The source electrode 450 may be located between the gate structure 500 and the first insulating structure 210. The drain electrode 430 may be located on the side of the second insulating structure 220 that is facing away from the gate structure 500. After the source electrode 450 and the drain electrode 430 are formed, the fourth mask layer 330 may be removed.

The type of ions doped into the source electrode 450 and the drain electrode 430 may be the same as the type of ions doped into the drift region 400. In one embodiment, the ions or dopant doped into the source electrode 450 and the drain electrode 430 may be N-type. The dopants may include one or more of P ions, As ions, Sb ions, and other suitable ions. The implantation energy to form the source electrode 450 and the drain electrode 430 may range from about 1 KeV to about 10 KeV. The implant wafer doses of the source electrode 450 and the drain electrode 430 may range from about 1E14 atom/$cm^2$, to about 5E15 atoms/$cm^2$.

Figure 8:
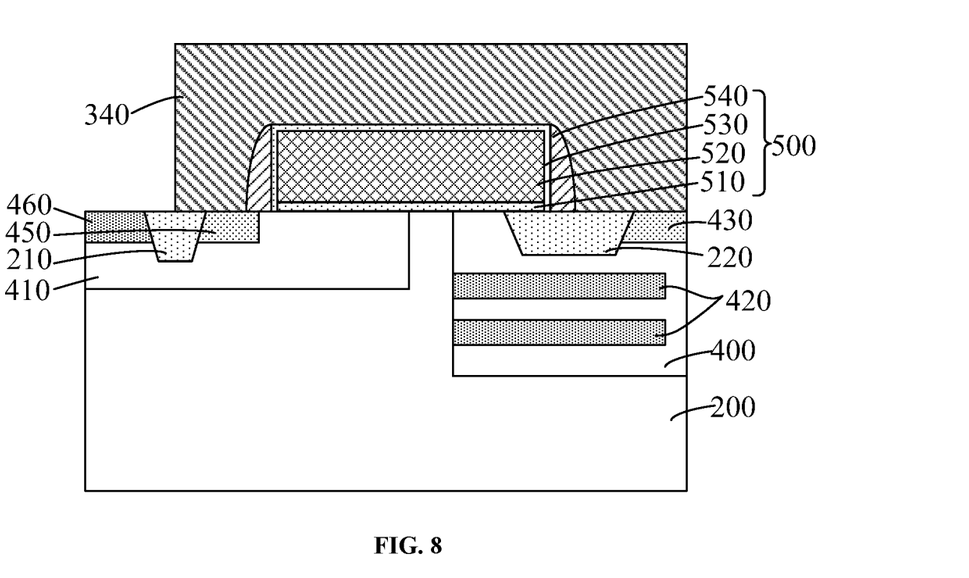

Returning to FIG. 14, after the source electrode and the drain electrode are formed, a body-tie electrode is formed in the well region on the side of the first insulating structure that is facing away from the source electrode (S107). FIG. 8 illustrates a corresponding semiconductor device.

As shown in FIG. 8, a body-tie electrode 460 may be formed in the well region 410 on the side of the first insulating structure 210 that is facing away from the source electrode 450.

Specifically, a process to form the body-tie electrode 460 may include the following steps. A fifth mask layer 340 may be formed on the semiconductor device 200. The fifth mask layer 340 may be a patterned mask. The fifth mask layer 340 may expose the region of the semiconductor substrate 200 corresponding to the subsequently-formed body-tie electrode 460. The fifth mask layer 340 may be used as a mask to perform a heavily-doped ion implantation process on the semiconductor substrate 200. The body-tie electrode 460 may be formed in the well region 410 on the side of the first insulating structure 210 that is facing away from the source electrode 450. After the body-tie electrode 460 is formed, the fifth mask layer 340 may be removed.

The type of ions doped into the body-tie electrode 460 may be different from the type of ions doped into the source electrode 450 and the drain electrode 430. In one embodiment, the type of ions doped into the body-tie electrode 460 may be P-type dopants, such as B ions and/or BF ions. The implantation energy to form the body-tie electrode 460 may range from about 1 KeV to about 10 KeV. The implant wafer dose of the body-tie electrode 460 may range from about 1E14 atoms/$cm^2$ to about 5E15 atoms/$cm^2$.

Figure 9:
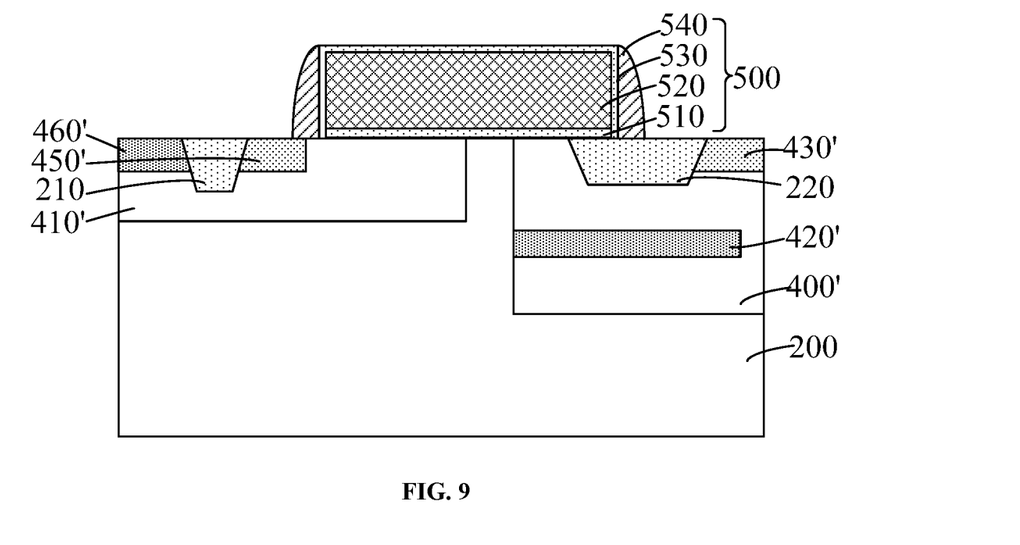
FIG. 9 illustrates a cross-sectional illustration of an exemplary LDMOS transistor formed by another exemplary fabrication process consistent with various disclosed embodiments.

The present disclosure further provides another embodiment of the fabrication method for forming the semiconductor device. As shown in FIG. 9, in the disclosed embodiment, the formed LDMOS transistor may be N-type.

Different from the structures illustrated in FIGS. 2-8, when the counter-doped region 420' is being formed in the semiconductor device exemplified in FIG. 9, a different number of ion implantation processes, different dopant concentrations or implant wafer doses, and different implantation energies may be implemented. The fabrication process for the structure illustrated in FIG. 9 may be referred to the previous descriptions and is not repeated herein.

More specifically, an ion implantation process may be performed on the semiconductor substrate 200 to form a P-type counter-doped region 420' in the N-type drift region 400'. Only one P-type counter-doped region 420' may be formed. The boundary of the P-type counter-doped region 420' facing the well region 410 may level with the boundary of the drift region 400'. The implant wafer dose of the P-type counter-doped region 420' may range from about 2E12 atoms/cm$^2$ to about 8E12 atoms/cm$^2$. The implantation energy may range from about 200 KeV to about 800 KeV.

Figure 10:
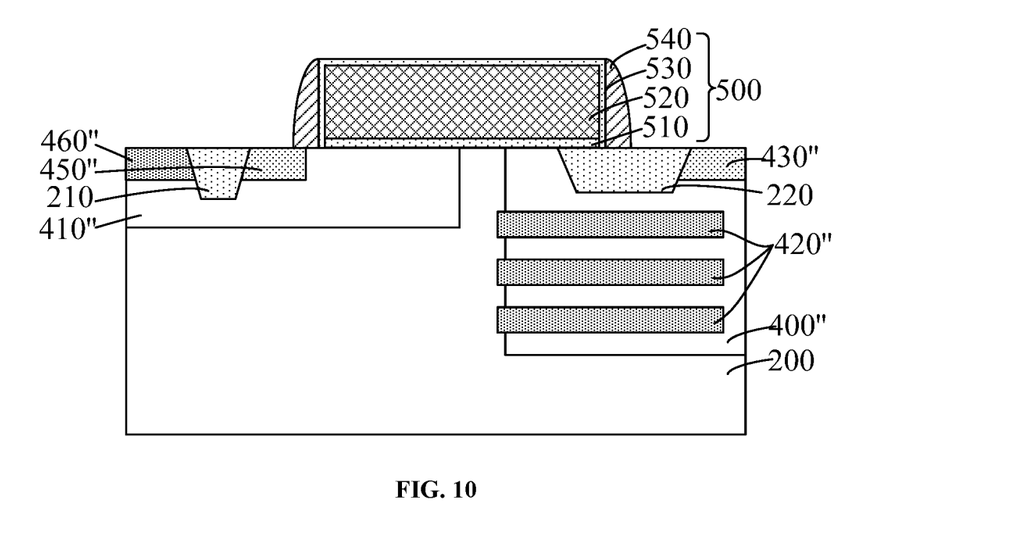
FIG. 10 is a cross-sectional illustration of an exemplary LDMOS transistor formed by another exemplary fabrication process consistent with various disclosed embodiments.

FIG. 10 illustrates another embodiment of the fabrication method for forming the semiconductor device. In the structure shown in FIG. 10, the formed LDMOS transistor may be P-type.

Different from the structures shown in FIGS. 2-8, as shown in FIG. 10, when the drift region 400", the well region 410", the source electrode 450", and the drain electrode 430" of the semiconductor device are being formed, different types of ions/dopants, different dopant concentrations or implant wafer doses, and different implantation energies may be implemented. Also, when the counter-doped region 420" is being formed in the semiconductor device exemplified in FIG. 10, a different number of ion implantation processes, different type of ions, different doping regions, different implant wafer doses, and different implantation energies may be implemented. The fabrication process to form the structure illustrated in FIG. 10 may be referred to the descriptions of the structures illustrated in FIGS. 2-8 and are not repeated herein.

In the structure shown in FIG. 10, the drift region 400" may be a P-type drift region, and the doped ions may include B ions and/or BF ions. The implant wafer dose of the drift region 400" may range from about 1E14 atoms/cm$^2$ to about 5E12 atoms/cm$^2$. The well region 410" may be an N-type well region, and the doped ions of the well region 410" may include P ions, As ions, and/or Sb ions. The implant wafer dose of the well region 410" may range from about 2E11 atoms/cm$^2$ to about 3E12 atoms/cm$^2$. The source electrode 450" and the drain electrode 430" may be P-type, and the ions doped into the source electrode 450" and the drain electrode 430" may include B ions and/or BF ions. The implantation energy to form the source electrode 450" and the drain electrode 430" may range from about 1 KeV to about 10 KeV. The implant wafer dose of the source electrode 450" and the drain electrode 430" may range from about 1E14 atoms/cm$^2$ to about 5E15 atoms/cm$^2$. The body-tie electrode 360" may be N-type. The ions doped into the body-tie electrode 360" may include P ions, As ions, and/or Sb ions. The implantation energy to form the body-tie electrode 460" may range from about 1 KeV to about 10 KeV. The implant wafer dose of the body-tie electrode 460" may range from about 1E14 atoms/cm$^2$ to about 5E15 atoms/cm$^2$.

In one embodiment, three ion implantation processes may be performed on the semiconductor substrate 200 to form three N-type counter-doped regions 420" in the P-type drift region 400. The three N-type counter-doped regions 420" may be arranged in the drift region 400" along a direction vertical to the semiconductor substrate 200. Each N-type counter-doped region 420" may be separated from another counter-doped region 420" by a certain distance. The boundaries of the N-type counter-doped regions 420" facing the well region 410" may exceed the boundary of the drift region 400". The N-type counter-doped regions 420" may include a first N-type counter-doped region, a second N-type counter-doped region, and a third N-type counter-doped region. The second N-type counter-doped region may be located under the first N-type counter-doped region. The third N-type counter-doped region may be located under the second N-type counter-doped region.

The dopants of the N-type counter-doped regions 420" may include P ions, As ions, and/or Sb ions. The implantation energy to form the first N-type counter-doped region may range from about 350 KeV to about 450 KeV. The implant wafer dose of the first N-type counter-doped region may range from about 2E12 atoms/cm$^2$ to about 6E12 atoms/cm$^2$. The implantation energy to form the second N-type counter-doped region may range from about 600 KeV to about 800 KeV. The implant wafer dose of the second N-type counter-doped region may range from about 2E12 atoms/cm$^2$ to about 5E12 atoms/cm$^2$. The implantation energy to form the third N-type counter-doped region may range from about 100 KeV to about 1200 KeV. The implant wafer dose of the third N-type counter-doped region may range from about 2E12 atoms/cm$^2$ to about 4E12 atoms/cm$^2$.

It should be noted that, although three embodiments are used to illustrate the disclosed fabrication method for forming the semiconductor device, the fabrication method should not be limited by the embodiments of the present disclosure. The subsequently-formed LDMOS transistor may be N-type or P-type. Based on the type of the LDMOS transistor, the dopants of the counter-doped regions may be N-type or P-type. One or more counter-doped regions may be formed in the LDMOS transistor. The boundaries of the counter-doped regions facing the well region may level with boundary of the drift region or may exceed the boundary of the drift region.

Accordingly, another aspect of the present disclosure provides a semiconductor device. The semiconductor device is formed using the disclosed fabrication method.

Figure 11:
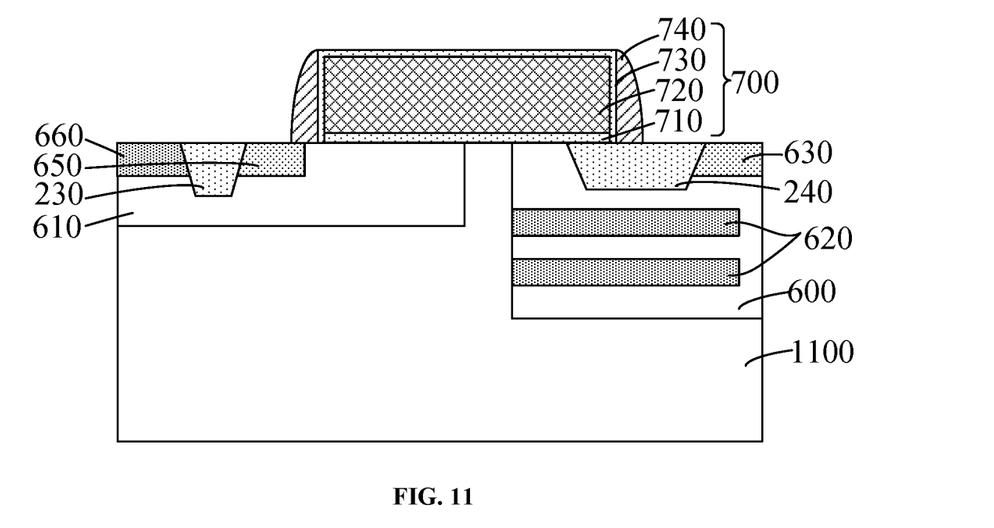
FIG. 11 is a cross-sectional illustration of an exemplary LDMOS transistor consistent with various disclosed embodiments.

FIG. 11 illustrates the structure of an exemplary semiconductor device. The semiconductor device may include a semiconductor substrate 1100, counter-doped regions 620, a gate electrode 700, a source electrode 650, and a drain electrode 630.

The semiconductor substrate 1100 may be made of single-crystal silicon. The semiconductor substrate 1100 may include a drift region 600 and a well region 610.

The counter-doped regions 620 may be located in the drift region 600. The type of dopants in the counter-doped regions 620 may be different from the type of dopants in the drift region 600. The boundaries of the counter-doped regions 620 facing the well region 610 may level with the boundary of the drift region 600. The boundaries of the counter-doped regions 620 facing away from the well region 610 may be within the drift region 600. One or more counter-doped regions 620 may be formed. When more than one counter-doped regions 620 are formed, the counter-doped regions 620 may be arranged along a direction vertical to the semiconductor substrate 1100. Each counter-doped region 620 may be separated from another counter-doped region 620 by a certain distance.

The gate structure 700 may cover a portion of the well region 610 and a portion of the drift region 600. The source region 650 may be located in the semiconductor substrate 1100 on one side of the gate structure 700. The source electrode 650 may be located in the well region 610. The drain region 630 may be located in the semiconductor substrate 1100 on one side of the gate structure 700. The source electrode 650 may be located in the drift region 600.

In one embodiment, two counter-doped regions 620 may be formed in the drift region 600. The two counter-doped regions 620 may be separated from each other along a direction vertical to the semiconductor substrate 1100. The boundaries of the counter-doped regions 620 facing the well region 610 may level with the boundary of the drift region 600 so that the drift region 600 may be divided into a plurality of parts along the direction vertical to the semiconductor substrate 1100. The boundaries of the counter-doped regions 620 facing away from the well region 610 may be within the drift region 600 so that electric current flowing into each part of the drift region 600 may flow into the drain electrode 630. When the LDMOS transistor is on, the electric current flowing into the drift region 600 may be diverged by the counter-doped regions 620 and may flow into each part of the drift region 600. Thus, impact ionization in the drift region 600 may be reduced. The breakdown voltage of the LDMOS transistor maybe increased.

In one embodiment, the semiconductor device may also include a first insulating structure 230 in the well region 610 and a second insulating structure 240 in the drift region 600.

The source electrode 650 may be located between the gate structure 700 and the first insulating structure 230. The drain electrode 630 may be located on the side of the second insulating structure 240 that is facing away from the gate structure 700. The counter-doped regions 620 may be located under the second insulating structure 240.

In one embodiment, the disclosed semiconductor device may further include a body-tie electrode 660. The body-tie electrode 660 may be located in the semiconductor substrate 1100 on the side of the first insulating structure 230 that is facing away from the source electrode 650. The body-tie electrode 660 may be located in the well region 610.

In one embodiment, the semiconductor device may be N-type. The well region 610, the body-tie electrode 660, and the counter-doped regions 620 may be doped with P-type dopants. The drift region 600, the source electrode 650, and the drain electrode 630 may be doped with N-type dopants.

In other various embodiments, when the semiconductor device is P-type. The well region 610, the body-tie electrode 660, and the counter-doped regions 620 may be doped with N-type dopants. The drift region 600, the source electrode 650, and the drain electrode 630 may be doped with P-type dopants.

Figure 12:
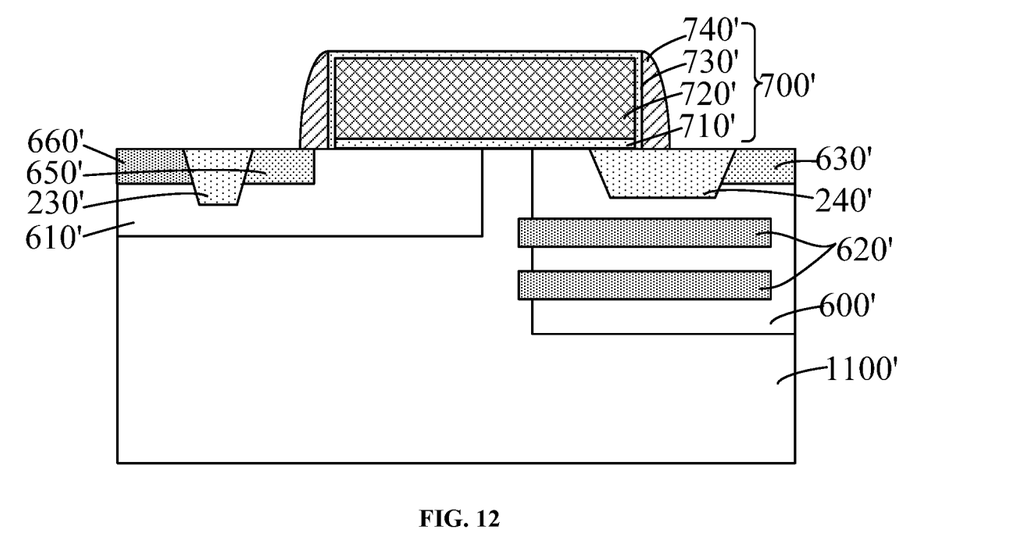
FIG. 12 is a cross-sectional illustration of another exemplary LDMOS transistor consistent with various disclosed embodiments.

FIG. 12 illustrates another disclosed semiconductor device. Different from the structure shown in FIG. 11, the boundaries of the counter-doped regions 620' facing the well region 610' may exceed the boundary of the drift region 600'. Detailed descriptions of such structure may be referred to previous descriptions of the present disclosure and are not repeated herein.

In one embodiment, two counter-doped regions 620' may be formed in the drift region 600'. The two counter-doped regions 620' may be separated from each other along a direction vertical to the semiconductor substrate 1100'. The boundaries of the counter-doped regions 620' facing the well region 610' may exceed the boundary of the drift region 600' so that the drift region 600' may be divided into a plurality of parts along the direction vertical to the semiconductor substrate 1100'. Compared to the first embodiment shown in FIG. 11, the divided drift region 600' may have improved performance.

Figure 13:
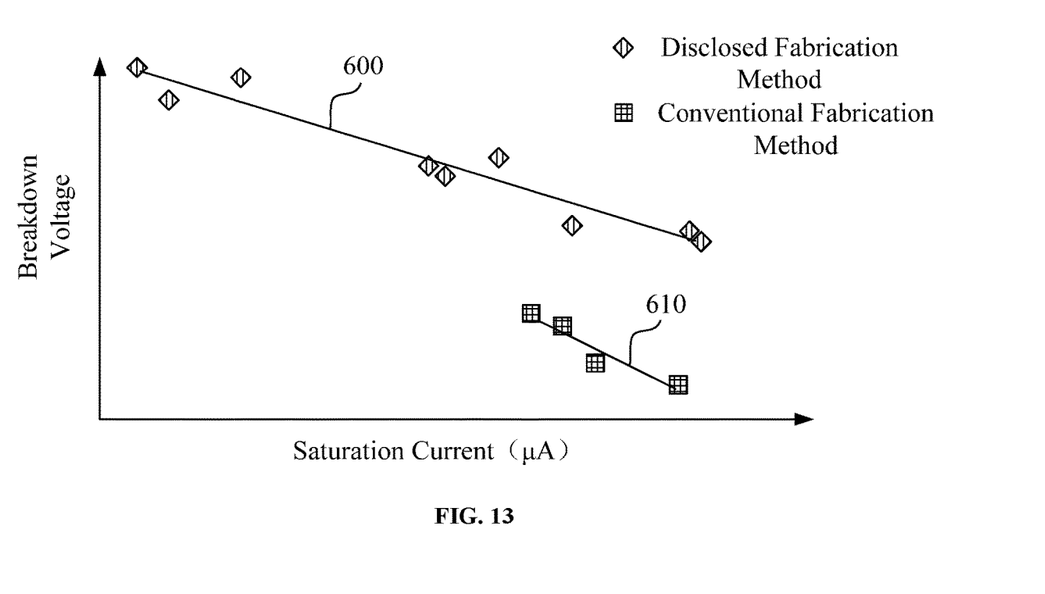
FIG. 13 illustrates a current-breakdown voltage plot of an exemplary LDMOS transistor consistent with various disclosed embodiments.

FIG. 13 illustrates the performance of certain semiconductor devices. As shown in FIG. 13, the X axis represents the saturation current (unit: micro Ampere/μA), and the Y axis represents the breakdown voltage (unit: Volt/V). The fitted curve 600 is the current-breakdown voltage curve of the LDMOS transistor formed by the disclosed fabrication method. The fitted curve 610 is the current-breakdown voltage curve of a LDMOS transistor formed by a conventional fabrication method. By comparing the fitting curve 610 and the fitting curve 600, it is shown that at the same current, the breakdown voltage of the LDMOS transistor formed by the disclosed fabrication method is higher than the breakdown voltage of the LDMOS transistor formed by a conventional fabrication method.

Although various embodiments are used to illustrate the disclosed semiconductor device, the actual structure of the semiconductor device should not be limited by the embodiments of the present disclosure. One or more counter-doped regions may be formed and may be arranged along a direction vertical to the semiconductor substrate. When more than one counter-doped regions are formed in the drift region, each counter-doped region may be separated from another counter-doped region by a certain distance. The boundaries of the counter-doped regions facing the well region may level with the boundary of the drift region or may exceed the boundary of the drift region.

Compared to a conventional fabrication method, the fabrication method provided in the present disclosure has several advantages.

For example, the present disclosure applies one or more counter-doped regions in the drift region. The counter-doped regions are arranged in a direction vertical to the semiconductor substrate. Each counter-doped region is separated from another counter-doped region by a certain distance. The drift region is thus divided into a plurality of parts by the counter-doped regions. When the LDMOS is turned on, electric current may diverged by the counter-doped regions and flow into each part of the drift region. Impact ionization in the drift region may be reduced. The breakdown voltage of the LDMOS transistor may be increased or improved.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A fabrication method for forming a semiconductor device, comprising:
   providing a semiconductor substrate;
   forming a first insulating structure, a second insulating structure, a well region and a drift region in the semiconductor substrate, the drift region being formed after the first insulating structure and the second insulating structure are formed, the first insulating structure being in the well region, and the second insulating structure being in the drift region;
   forming a mask layer on the semiconductor substrate after forming the first insulating structure, the second insulating structure, the well region and the drift region;
   forming a plurality of counter-doped regions in the drift region through an opening in the mask layer, the plurality of counter-doped regions being directly below the second insulating structure and aligned along a direction vertical to a surface of the semiconductor substrate to divide the drift region into a plurality of parts, and the mask layer containing the opening having a sidewall perpendicular to the surface of the semiconductor substrate and aligned with an edge of the drift region and an edge of each of the plurality of counter-doped regions facing the well region, the plurality of counter-doped regions in the drift region being separated by the drift region, wherein the edge of the drift region facing the well region and the edge of each of the plurality of counter-doped regions facing the well region are leveled with each other and perpendicular to the surface of the semiconductor substrate;

forming a gate structure on the semiconductor substrate, the gate structure covering a portion of the well region and a portion of the drift region; and forming a source electrode in the well region on one side of the gate structure between the first insulating structure and the gate structure, and a drain electrode in the drift region on a side of the second insulating structure away from the gate structure.

2. The fabrication method according to claim 1, wherein: a type of ions doped in the plurality of counter-doped regions is different from a type of ions doped in the drift region.

3. The fabrication method according to claim 2, wherein in the plurality of counter-doped regions, each counter-doped region is separated from another counter-doped region by a certain distance in the drift region.

4. The fabrication method according to claim 3, wherein forming the plurality of counter-doped regions in the drift region comprises:

performing a plurality of ion implantation processes in the drift region through the opening in the mask layer to form the plurality of counter-doped regions directly below the second insulating structure, wherein:

the plurality of counter-doped regions have different doping depths, doping concentrations of the ions doped in the plurality of counter-doped regions decrease as the doping depths increase by increasing implantation energies of the plurality of ion implantation processes as the doping depths increase while keeping doping doses of the ions doped in the plurality of counter-doped regions the same.

5. The fabrication method according to claim 2, wherein: an implantation dose in each counter-doped region is higher than an implantation dose in the drift region.

6. The fabrication method according to claim 4, wherein: an implantation energy to form a first counter-doped region in the plurality of counter-doped regions ranges from about 200 KeV to about 400 KeV, and an implantation energy to form a second counter-doped region in the plurality of counter-doped regions ranges from about 600 KeV to about 800 KeV.

7. The fabrication method according to claim 4, wherein: an implantation dose of a first counter-doped region in the plurality of counter-doped regions ranges from about 3E12 atoms/cm$^2$ to about 6E12 atom/cm$^2$, and an implantation dose of a second counter-doped region in the plurality of counter-doped regions ranges from about 2E12 atoms/cm$^2$ to about 5E12 atom/cm$^2$.

8. The fabrication method according to claim 1, wherein: ions doped in the plurality of counter-doped regions have a great atom mass, including one or more of P, As, and Sb.

9. The fabrication method according to claim 1, wherein: the well region and the drift region are distanced from each other in the semiconductor substrate.

10. A fabrication method for forming a semiconductor device, comprising:

providing a semiconductor substrate;

forming a first insulating structure, a second insulating structure, a well region and a drift region in the semiconductor substrate, the drift region being formed after the first insulating structure and the second insulating structure are formed, the first insulating structure being in the well region, and the second insulating structure being in the drift region;

after forming the first insulating structure, the second insulating structure, the well region and the drift region, forming a plurality of counter-doped regions in the drift region, the plurality of counter-doped regions being directly below the second insulating structure and aligned along a direction vertical to a surface of the semiconductor substrate to divide the drift region into a plurality of parts, and a mask layer containing an opening having a sidewall perpendicular to the surface of the semiconductor substrate and aligned with an edge of the drift region and an edge of each of the plurality of counter-doped regions facing the well region, the plurality of counter-doped regions in the drift region being separated by the drift region, wherein the edge of the drift region facing the well region and the edge of each of the plurality of counter-doped regions facing the well region are leveled with each other and perpendicular to the surface of the semiconductor substrate;

forming a gate structure on the semiconductor substrate, the gate structure covering a portion of the well region and a portion of the drift region;

forming a source electrode in the well region on one side of the gate structure between the first insulating structure and the gate structure, and a drain electrode in the drift region on a side of the second insulating structure away from the gate structure; and forming a body-tie electrode in the well region, the first insulating structure located between the body-tie electrode and the source electrode.

11. The fabrication method according to claim 10, wherein a first type of ions doped into the body-tie electrode is different from a second type of ions doped into the source electrode and the drain electrode.

12. The fabrication method according to claim 11, wherein an implantation energy to form the body-tie electrode ranges from 1 KeV to 10 KeV.

13. The fabrication method according to claim 11, wherein an implantation dose of the body-tie electrode ranges from 1E14 atoms/cm$^2$ to 5E15 atoms/cm$^2$.

14. The fabrication method according to claim 10, wherein:

the semiconductor device is N-type, the well region, the body-tie electrode, and the counter-doped regions being doped with P-type dopants, and the drift region, the source electrode, and the drain electrode being doped with N-type dopants.

* * * * *